United States Patent
Kim et al.

(10) Patent No.: US 9,344,657 B2
(45) Date of Patent: May 17, 2016

(54) DEPTH PIXEL AND IMAGE PICK-UP APPARATUS INCLUDING THE SAME

(71) Applicant: Samsung Electronics Co., Ltd, Suwon-si, Gyeonggi-do (KR)

(72) Inventors: Seoung-Hyun Kim, Hwaseong-si (KR); Yoon-Dong Park, Osan-si (KR); Yong-Jei Lee, Seongnam-si (KR); Joo-Yeong Gong, Suwon-si (KR); Hee-Woo Park, Seoul (KR); Seung-Won Cha, Daejeon (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 64 days.

(21) Appl. No.: 14/093,083

(22) Filed: Nov. 29, 2013

(65) Prior Publication Data
US 2014/0253905 A1    Sep. 11, 2014

(30) Foreign Application Priority Data

Mar. 6, 2013    (KR) .................. 10-2013-0023657

(51) Int. Cl.
| | |
|---|---|
| H04N 5/378 | (2011.01) |
| G01C 15/06 | (2006.01) |
| G01S 17/89 | (2006.01) |
| G01S 7/491 | (2006.01) |
| G01S 7/493 | (2006.01) |
| H01L 27/146 | (2006.01) |

(52) U.S. Cl.
CPC ............... *H04N 5/378* (2013.01); *G01C 15/06* (2013.01); *G01S 7/493* (2013.01); *G01S 7/4914* (2013.01); *G01S 17/89* (2013.01); *H01L 27/14603* (2013.01); *H01L 27/14609* (2013.01)

(58) Field of Classification Search
CPC ............ G09G 5/10; G01S 17/89; G01C 3/08
See application file for complete search history.

(56) References Cited

U.S. PATENT DOCUMENTS

| | | | |
|---|---|---|---|
| 2006/0192938 A1 | 8/2006 | Kawahito | |
| 2007/0103748 A1 | 5/2007 | Hashimoto et al. | |
| 2010/0123771 A1* | 5/2010 | Moon | G01C 3/08 348/46 |
| 2010/0290674 A1 | 11/2010 | Kim | |
| 2011/0019049 A1 | 1/2011 | Jin et al. | |
| 2011/0291164 A1 | 12/2011 | Bamji et al. | |
| 2011/0304696 A1 | 12/2011 | Centen et al. | |
| 2012/0059625 A1 | 3/2012 | Kim et al. | |
| 2012/0075615 A1 | 3/2012 | Niclass et al. | |
| 2014/0071180 A1* | 3/2014 | Shin et al. ............ 345/690 |

FOREIGN PATENT DOCUMENTS

| | | |
|---|---|---|
| JP | 2008-032427 | 2/2008 |
| JP | 2008-116309 | 5/2008 |
| JP | 2010-071832 | 4/2010 |

* cited by examiner

*Primary Examiner* — Luke Ratcliffe
(74) *Attorney, Agent, or Firm* — Muir Patent Law, PLLC

(57) ABSTRACT

A depth pixel of an image sensor includes a depth sensing element configured to generate first charges that are photo-electrically converted from a light reflected from an object, a first floating diffusion node configured to receive the first charges from the depth sensing element, a second floating diffusion node configured to output second charges corresponding to a component of a reflection light where a component of an ambient light is cancelled, and an ambient light cancellation circuit configured to detect the ambient light to control a barrier level of a charge transfer path between the first floating diffusion node and the second floating diffusion node in response to the ambient light.

18 Claims, 10 Drawing Sheets

DEPTH PIXEL AND IMAGE PICK-UP APPARATUS INCLUDING THE SAME

CROSS-REFERENCE TO RELATED APPLICATIONS

This application claims the benefit of priority under 35 U.S.C. §119 to Korean Patent Application No. 10-2013-0023657, filed on Mar. 6, 2013, in the Korean Intellectual Property Office, the content of which is incorporated herein in its entirety by reference.

BACKGROUND

1. Field

Example embodiments relate generally to an image sensor, and more particularly to a depth pixel that captures depth data of an object by measuring a time of flight (TOF) of a modulation light and an image pick-up apparatus that includes the depth pixel.

2. Description of the Related Art

Recently, image sensors configured to acquire depth data using a photo gate have been suggested. The image sensor acquires the depth data of a subject by calculating the TOF of an illumination light or a modulation light based on the difference between an amount of photo-electrically converted charges stored in a first photo cell that operates in a timing of the illumination light and a second photo cell that operates in a 180° phase-delayed timing. Thus, in order to improve the accuracy of the depth image in depth capturing technology that uses a photo gate or a photodiode, it is necessary to increase a sensitivity of the photo gate or the photodiode or to increase an intensity of a reflection light by increasing a power of the illumination light. However, increasing the power of the illumination light may cause a great amount of power to be consumed. In addition, if a modulation frequency of the illumination light is increased or a duty cycle of a modulation waveform is reduced to improve accuracy, the maximum distance or depth that may be sensed may be reduced. At this time, the maximum sensing distance Zmax may be determined based on the waveform and the duty cycle of the illumination light.

The accuracy of the depth image is proportional to the intensity of the illumination light and inversely proportional to the duty cycle of the illumination cycle. Thus, the accuracy of the depth image may be improved by increasing the intensity of the illumination light and reducing the duty cycle of the illumination light. However, if a noise component of an ambient light, such as a solar light, is significantly greater than a magnitude of a scanning light in an image sensor, then it is necessary to compensate for the noise component. If the full well capacity of the photo cell is increased to prevent saturation of the photo cell caused by the ambient light, the conversion gain/sensitivity is reduced so that the signal-to-noise ratio (SNR) is reduced, resulting in an increase of a depth error.

SUMMARY

The present general inventive concept provides a depth pixel and an image sensor configured to improve the capture characteristic of depth data by canceling charges caused by an ambient light from charges sensed in the depth pixel by forming a barrier level that responds to the ambient light in a charge transfer path.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a depth pixel of an image sensor that includes a depth sensing element configured to generate first charges that are photo-electrically converted from a light reflected from an object, a first floating diffusion node configured to receive the first charges from the depth sensing element, a second floating diffusion node configured to output second charges corresponding to a component of a reflection light where a component of an ambient light is cancelled, and an ambient light cancellation circuit configured to detect the ambient light to control a barrier level of a charge transfer path between the first floating diffusion node and the second floating diffusion node in response to the ambient light.

The ambient light cancellation circuit may include a photo sensing element configured to generate third charges that are photo-electrically converted from the ambient light, a third floating diffusion node, a charge transfer element configured to transfer the third charges from the photo sensing element to the third floating diffusion node in response to a transfer control signal, and an ambient light cancellation element connected between the first floating diffusion node and the second floating diffusion node and configured to form the barrier level of the charge transfer path in response to the third charges transferred from the photo sensing element to the third floating diffusion node.

The photo sensing element may be disposed adjacent to the depth sensing element and the photo sensing element may have a light receiving area smaller than a light receiving area of the depth sensing element.

The ambient light cancellation circuit may further include a reset control element configured to reset the third floating diffusion node to a reset state in response to a reset control signal.

The ambient light cancellation circuit may further include a shut-off control element configured to set the third floating diffusion node to a shut-off state in response to a shut-off control signal to block a charge transfer between the first floating diffusion node and the second floating diffusion node.

The ambient light cancellation element may be configured to be activated before the first charges of the depth sensing element are transferred to the first floating diffusion node.

The first floating diffusion node and the second floating diffusion node may be configured to be reset after the ambient light cancellation element is set to the shut-off state.

The depth sensing element may include a pair of photo gates and the ambient light cancellation circuit may be disposed adjacent to the photo gates.

The depth sensing element may include a pair of photo gates and the ambient light cancellation circuit may be disposed between the photo gates.

The depth sensing element may include a pair of depth sensing elements and the ambient light cancellation circuit may be disposed between the pair of depth sensing elements and shared by the pair of depth sensing elements.

The foregoing and/or other features and utilities of the present general inventive concept may also be achieved by providing an image pick up apparatus that includes a light source configured to radiate a modulation light, and a pixel array in which a plurality of depth pixels are arranged in a form of a matrix. At least one depth pixel includes a depth sensing element configured to generate first charges that are photo-electrically converted from a light, which includes the modulation light, reflected from an object, a first floating diffusion node configured to receive the first charges from the depth sensing element, a second floating diffusion node configured to output second charges corresponding to a component of a reflection light where a component of an ambient light is cancelled, and an ambient light cancellation circuit configured to detect the ambient light to control a barrier level of a charge transfer path between the first floating diffusion node and the second floating diffusion node in response to the ambient light.

The ambient light cancellation circuit may include a photo sensing element configured to generate third charges that are photo-electrically converted from the ambient light, a third floating diffusion node, a charge transfer element configured to transfer the third charges from the photo sensing element to the third floating diffusion node in response to a transfer control signal, and an ambient light cancellation element connected between the first floating diffusion node and the second floating diffusion node and configured to form the barrier level of the charge transfer path in response to the third charges transferred from the photo sensing element to the third floating diffusion node.

The ambient light cancellation circuit may further include a reset control element configured to reset the third floating diffusion node to a reset state in response to a reset control signal.

The ambient light cancellation circuit may further include a shut-off control element configured to set the third floating diffusion node to a shut-off state in response to a shut-off control signal to block a charge transfer between the first floating diffusion node and the second floating diffusion node.

The foregoing and/or other features and utilities of the present general inventive concept may also be achieved by providing a method of calculating a distance between an image sensor apparatus and a subject that includes receiving, at an electronic processor, a first signal that corresponds to a difference of a time period of a time of flight of a modulated light transmitted from the image sensor apparatus to the subject and reflected from the subject to the image sensor apparatus subtracted from a time period of a half of a cycle of the modulated light, receiving, at the electronic processor, a second signal that corresponds to the time period of the time of flight, and calculating, via the electronic processor, the distance as equal to a quotient of a product divided by a sum, the product equal to one half of the speed of light multiplied by the time period of the half of the cycle multiplied by the second signal, and the sum equal to the first signal added to the second signal.

In an example embodiment, each of the first signal and the second signal may have a compensation for an effect of ambient light.

In an example embodiment, the compensation may be accomplished by establishing a barrier to a transfer of charges that is proportional to an intensity of the ambient light.

In an example embodiment, the compensation may include a first compensation for the first signal and a second compensation for the second signal, the first compensation different from the second compensation.

The foregoing and/or other features and utilities of the present general inventive concept may also be achieved by providing a non-transitory computer-readable recording medium containing instructions which, when executed by an electronic processing element, cause the electronic processing element to perform a method, the method including receiving, at an electronic processor, a first signal that corresponds to a difference of a time period of a time of flight of a modulated light transmitted from the image sensor apparatus to the subject and reflected from the subject to the image sensor apparatus subtracted from a time period of a half of a cycle of the modulated light, receiving, at the electronic processor, a second signal that corresponds to the time period of the time of flight, and calculating, via the electronic processor, the distance as equal to a quotient of a product divided by a sum, the product equal to one half of the speed of light multiplied by the time period of the half of the cycle multiplied by the second signal, and the sum equal to the first signal added to the second signal.

The ambient light cancellation element may be configured to be activated before the first charges of the depth sensing element are transferred to the first floating diffusion node.

As described above, the depth pixel and the image sensor according to embodiments of the present general inventive concept may have a superior depth capturing characteristic under external lighting conditions.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
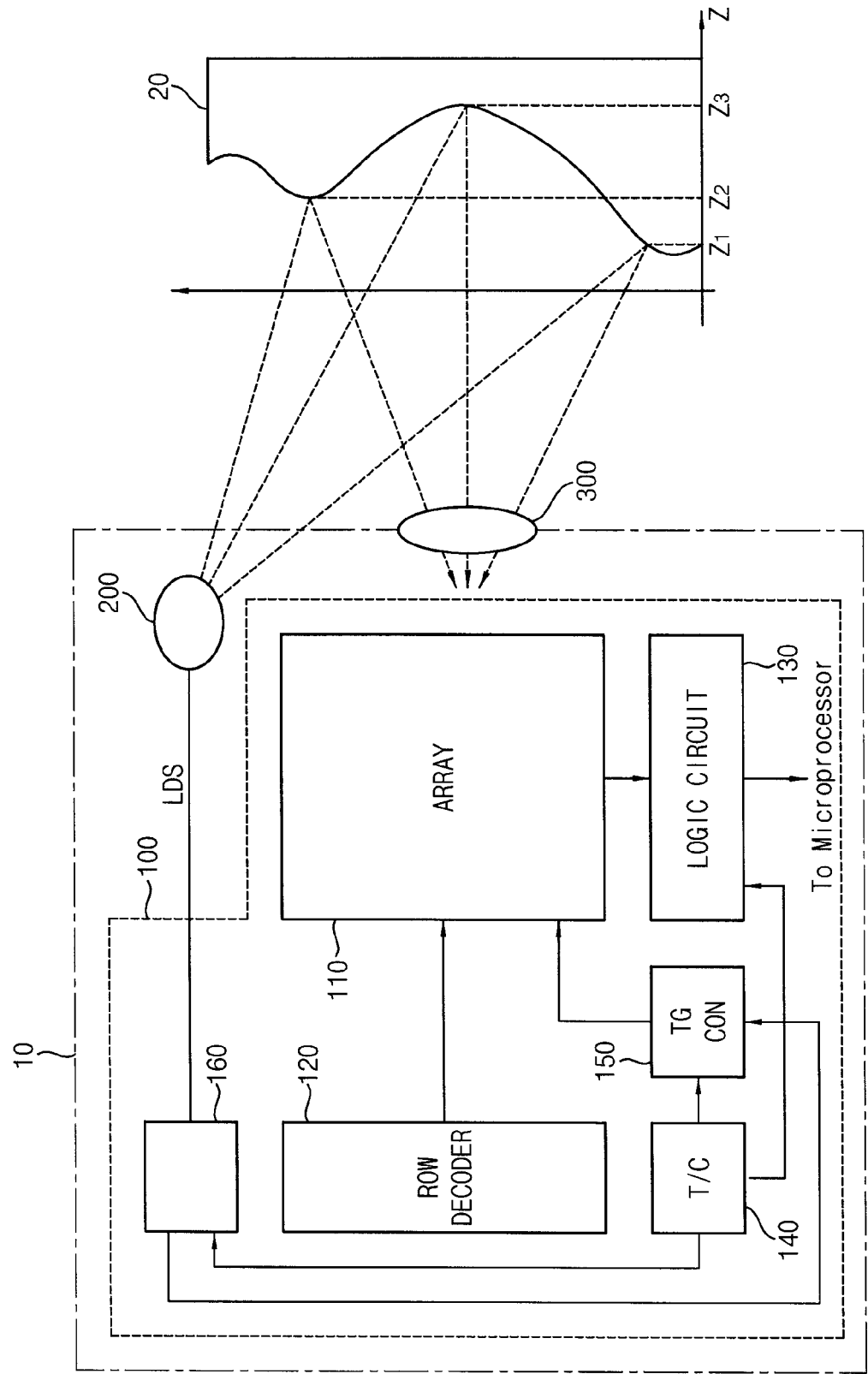
FIG. 1 is a block diagram illustrating an image pick-up apparatus according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
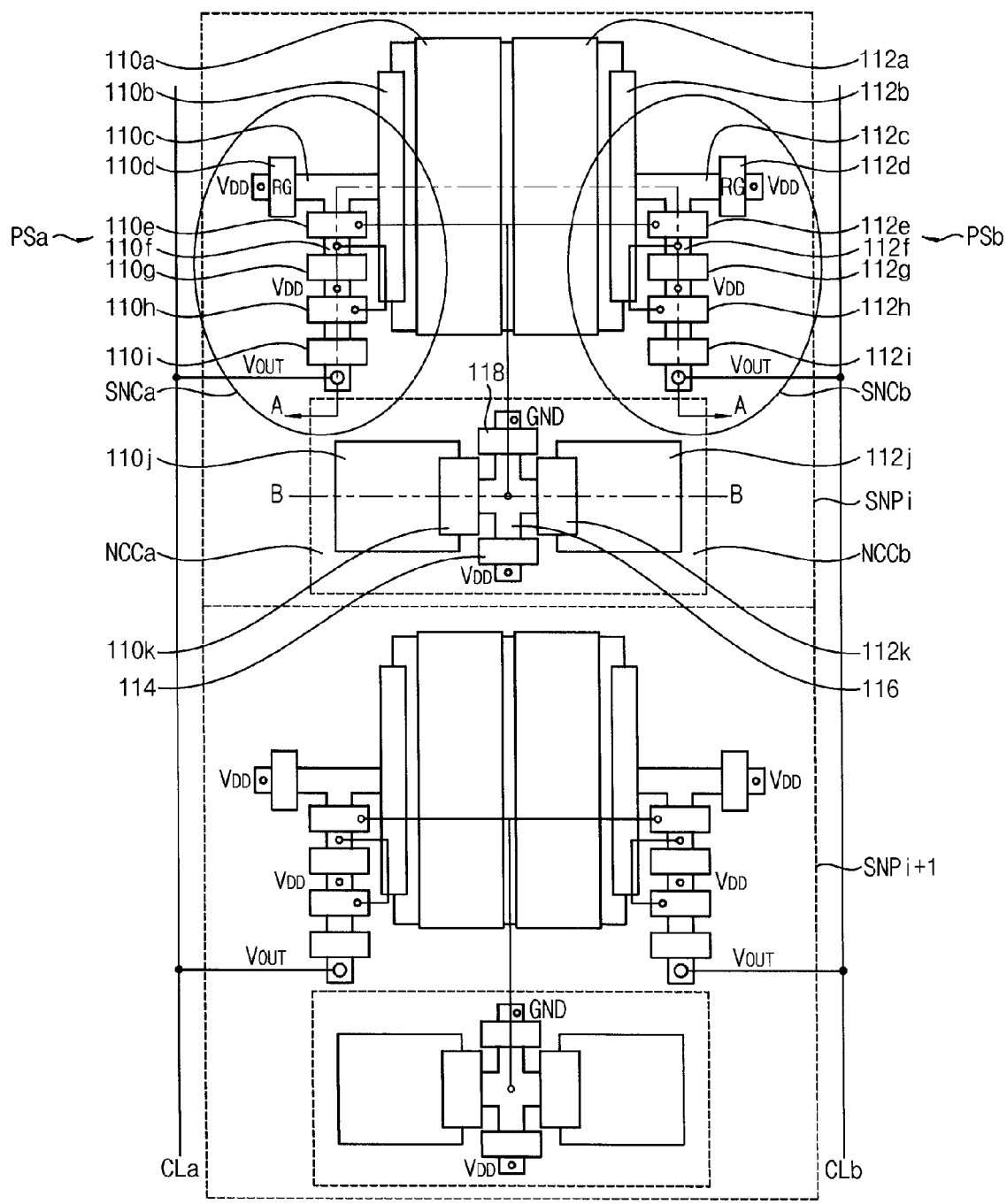
FIG. 2 is a partial plan view illustrating pixel pairs aligned in the column direction (Y direction) on a pixel array of FIG. 1.

FIG. 1 is a block diagram that illustrates an image pick-up apparatus 10 according to an embodiment of the inventive concept and FIG. 2 is a partial plan view that illustrates pixel pairs aligned in the column direction (Y direction) on the pixel array 110 of FIG. 1.

Referring to FIG. 1, the image pick up apparatus 10 may include an image sensor 100 that has a pixel array 110 on which a plurality of depth sensors (detectors or pixels) (not illustrated) may be aligned in the form of a matrix (not illustrated), a light source 200, and a lens module 300.

For example, the light source 200 may radiate a near-infrared light modulated to have a frequency of 20 MHz. The lens module 300 may focus the modulated reflection light reflected from a subject 20 onto the pixel array 110. In addition, the lens module 300 may include a filter (not illustrated) that allows a light that has a wavelength band of near-infrared light to pass therethrough. Concurrently, an ambient light component (not illustrated), such as, for example, a solar light, may be incident onto the pixel array 110 through the lens module 300.

The image sensor 100 may include the pixel array 110, a row decoder 120, a logic circuit 130, a timing controller 140, a photo gate controller 150, and a light source driver 160. Each of the sensors (not illustrated), which are implemented on the pixel array 110 in a two dimensional configuration, includes a pair of photo gates (not illustrated). In addition, each sensor includes a plurality of transistors (not illustrated) to process signals.

The row decoder 120 may select one of the rows (not illustrated) in response to a row address output from the timing controller 140. The row may refer to a set of sensors aligned in the X-direction in the pixel array 110. Under the control of the timing controller 140, the photo gate controller 150 may generate a first set of photo gate control signals, for example, a first photo gate control signal PGa (see FIG. 3) and a second photo gate control signal PGb (see FIG. 3), to provide the photo gate control signals to the pixel array 110. A phase difference between the first photo gate control signal PGa and the second photo gate control signal PGb may be 180°.

Under the control of the timing controller 140, the light source driver 160 may generate a driving signal LDS to drive the light source 200. In response to the driving signal LDS, the light source 200 may radiate the modulated light signal to the subject 20. An LED, an OLED, or a laser diode may be used, for example, as the light source 200.

The light source driver 160 may supply timing information about the driving signal LDS to the photo gate controller 150. Thus, the photo gate controller 150 may generate the first photo gate control signal PGa that has a phase the same as that of the driving signal LDS and the second photo gate control signal PGb that has a phase difference of 180° with respect to the phase of the driving signal LDS. For example, the photo gate controller 150 may be synchronized with the light source driver 160.

Under the control of the timing controller 140, the logic circuit 130 may process the signals detected by the sensors aligned on the pixel array 110 to output processed signals to the microprocessor (not illustrated). The microprocessor may calculate the distance based on the processed signals. The logic circuit 130 may include an analog-digital conversion block (not illustrated) configured to convert the signals output from the pixel array 110 into digital signals. The logic circuit 130 may further include a correlated double sampling (CDS) block (not illustrated) to perform the correlated double sampling with respect to the digital signals output from the analog-digital conversion block. In addition, the logic circuit 130 may further include a column decoder (not illustrated) to provide, under the control of the timing controller 140, the signals output from the analog-digital conversion block and the CDS block to the microprocessor. The reflected optical signals may be incident onto the pixel array 110 through the lens module 300.

Although the image pick-up apparatus 10 may include, for example, a plurality of light sources circularly aligned around the lens module 300, only one light source 200 is illustrated for the purpose of convenience of explanation. The optical signals incident onto the pixel array 110 through the lens module 300 may be demodulated, for example, by a plurality of depth sensors (see FIG. 2). That is, the optical signals incident onto the pixel array 110 through the lens module 300 may form an image.

Referring to FIG. 2, each of the depth sensors SNPi and SNPi+1 may include a pair of depth pixels or photo sensor circuits PSa and PSb. The photo sensor circuits PSa and PSb may include, respectively, depth sensing elements including first and second photo gates 110a and 112a configured to perform photo-electric conversion, sensing circuits SNCa and SNCb, and ambient light cancellation circuits NCCa and NCCb.

For example, the first and second photo gates 110a and 112a may be aligned on a P type substrate 102 (see FIG. 3) in the row direction and the ambient light cancellation circuits NCCa and NCCb may be aligned between the first and second photo gates 110a and 112a in the column direction such that the ambient light cancellation circuits NCCa and NCCb are adjacent to the first and second photo gates 110a and 112a in one-to-one correspondence. For example, the sensing circuit SNCa may be formed to the left of the first photo gate 110a and the sensing circuit SNCb may be formed to the right of the second photo gate 112a. The first and second photo gates 110a and 112a may be formed by using, for example, transparent poly silicon, indium tin oxide (ITO) (or tin-doped indium oxide), indium zinc oxide (IZO), or zinc oxide (ZnO). Each of the first and second photo gates 110a and 112a may allow a near-infrared ray, which is incident through the lens module 300, to pass therethrough.

The sensing circuits SNCa and SNCb may include, for example, respectively, first transfer gates 110b and 112b, first floating diffusion nodes 110c and 112c, first reset gates 110d and 112d, ambient light cancellation gates 110e and 112e, second floating diffusion nodes 110f and 112f, second reset gates 110g and 112g, drive gates 110h and 112h, and select gates 110i and 112i. The ambient light cancellation circuits NCCa and NCCb may include, respectively, PN junction areas 110j and 112j and second transfer gates 110k and 112k, and may share a third reset gate 114, a third floating diffusion node 116 and a ground gate 118.

Figure 3:
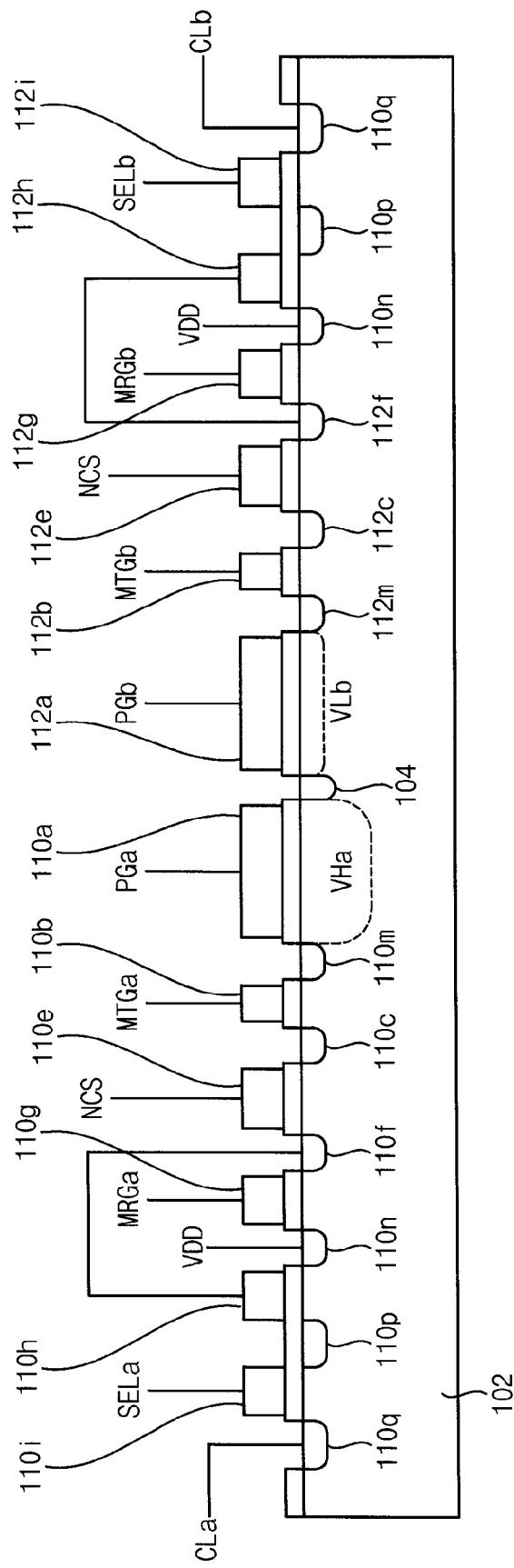
FIG. 3 is a sectional view taken along line A-A of FIG. 2.
Figure 4:
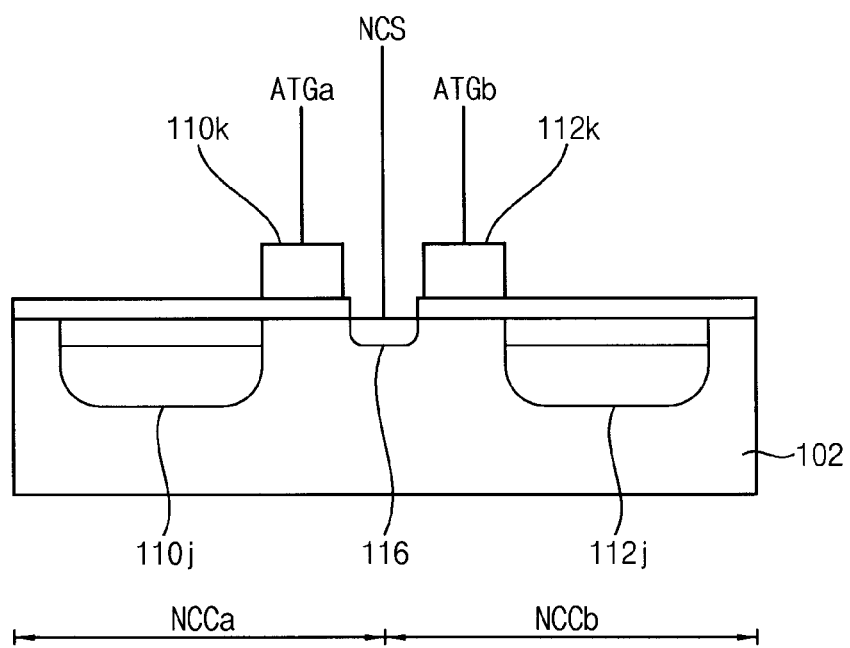
FIG. 4 is a sectional view taken along line B-B of FIG. 2.
Figure 5:
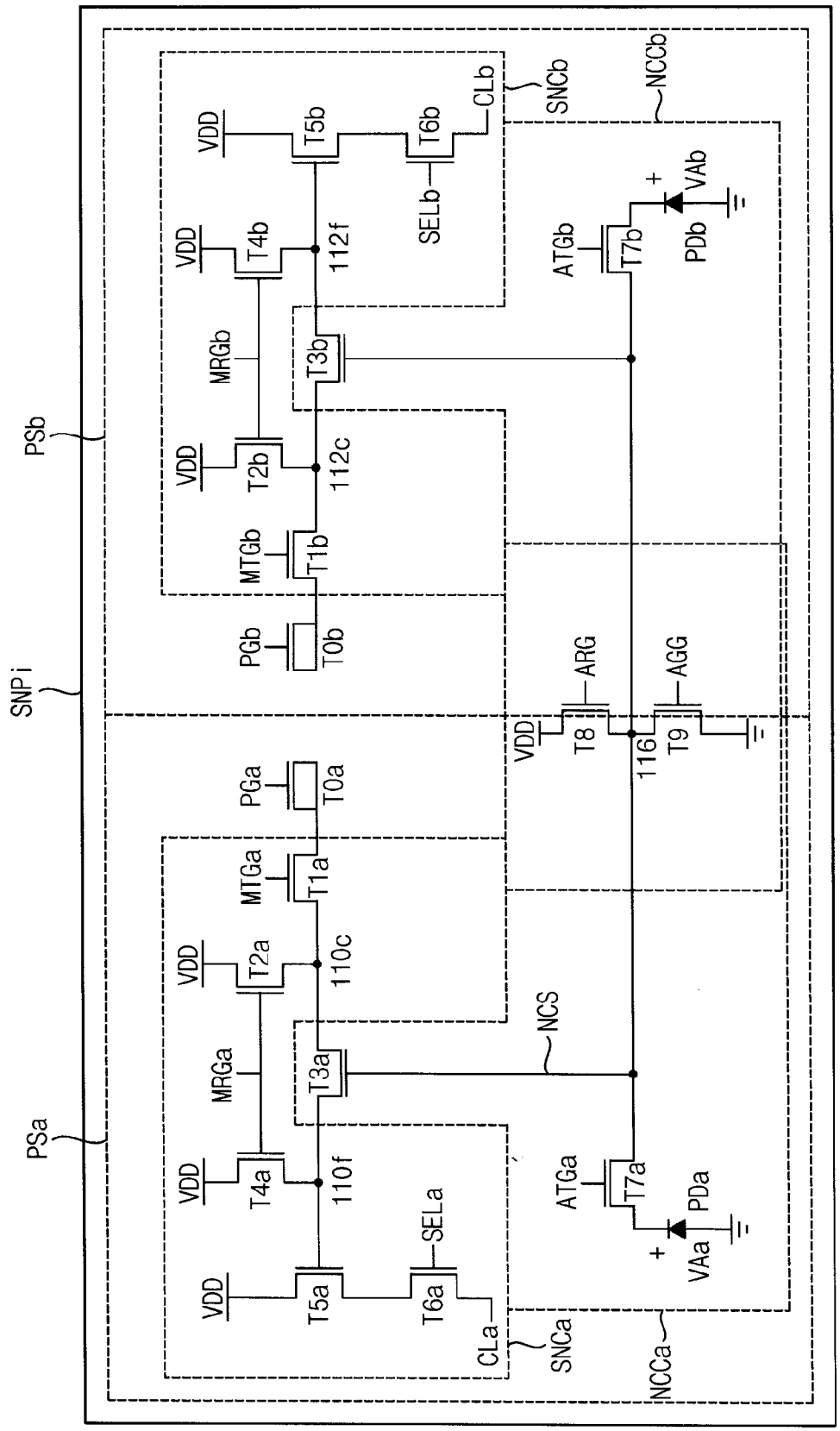
FIG. 5 is a schematic diagram illustrating an equivalent circuit of a depth sensor of FIG. 2.

FIG. 3 is a sectional view taken along line A-A of FIG. 2, FIG. 4 is a sectional view taken along line B-B of FIG. 2, and FIG. 5 is a schematic diagram that illustrates an equivalent circuit of the depth sensor SNPi of FIG. 2.

Referring to FIG. 3, the P type substrate 102 of the sensing circuits SNCa and SNCb may be provided therein with the first floating diffusion nodes 110c and 112c, the second floating diffusion nodes 110f and 112f, the third floating diffusion node 116 (see FIG. 4), first diffusion nodes 110n and 112n, second diffusion nodes 110p and 112p, and third diffusion nodes 110q and 112q. The first floating diffusion nodes 110c and 112c, the second floating diffusion nodes 110f and 112f, the third floating diffusion node 116 (see FIG. 4), the first diffusion nodes 110n and 112n, the second diffusion nodes 110p and 112p, and the third diffusion nodes 110q and 112q may be doped with N type impurities. The second floating diffusion nodes 110f and 112f may be connected, respectively, to the drive gates 110h and 112h. The drive gates 110h and 112h may serve as source followers.

A silicon oxide layer (not illustrated) may be formed, for example, on the P type substrate 102, and the first and second photo gates 110a and 112a, the first transfer gates 110b and 112b, the ambient light cancellation gates 110e and 112e, the second reset gates 110g and 112g, the drive gates 110h and 112h, the select gates 110i and 112i, and the second transfer gates 110k and 112k may be formed on the silicon oxide layer. The first and second photo gates 110a and 112a may be formed by using, for example, transparent poly silicon, indium tin oxide (ITO) (or tin-doped indium oxide), indium zinc oxide (IZO), or zinc oxide (ZnO). Each of the first and second photo gates 110a and 112a may allow a near-infrared ray, which is incident through the lens module 300, to pass therethrough.

An isolation region 104 may be formed, for example, in the P type substrate 102 to prevent photo charges generated in the P type substrate 102 from interfering with each other due to the first and second photo gates 110a and 112a. For example, the P type substrate 102 may be an epitaxial substrate doped with P type impurities and the isolation area 104 may be doped with P+ impurities. The isolation region 104 may be formed, for example, through the shallow trench isolation (STI) scheme or the location oxidation of silicon (LOCOS) scheme.

During the integration period, the first photo gate control signal PGa may be supplied to the first photo gate 110a and the second photo gate control signal PGb may be supplied to the second photo gate 112a. In addition, first transfer control signals MTGa and MTGb, which may be used to transfer the photo charges generated in the P type substrate 102 under the first and second photo gates 110a and 112a, may be supplied, respectively, to the first transfer gates 110b and 112b.

First and second bridging diffusion regions 110m and 112m may be formed, for example, in the P type substrate 102 between the first and second photo gates 110a and 112a and the first transfer gates 110b and 112b. The first and second bridging diffusion regions 110m and 112m may be doped, for example, with N type impurities.

Charges may be generated by optical signals incident onto the P type substrate 102 through the first and second photo gates 110a and 112a. If the first transfer control signal MTGa having a first level (for example, 1.0 V) is supplied to the first transfer gate 110b and the first photo gate control signal PGa having a high level (for example, 3.3 V) is supplied to the first photo gate 110a, the charges generated in the P type substrate 102 may be collected under the first photo gate 110a and the collected charges may be transferred to the first floating diffusion node 110c directly or through the first bridging diffusion region 110m. Concurrently, if the first transfer control signal MTGb having a first level (for example, 1.0 V) is supplied to the first transfer gate 112b and the second photo gate control signal PGb having a low level (for example, 0 V) is supplied to the second photo gate 112a, the charges may be generated in the P type substrate 102 under the second photo gate 112a, but the charges may not be transferred to the first floating diffusion node 112c.

In FIG. 3, VHa may represent a region where potentials or charges are accumulated when the first photo gate control signal PGa having a high level is supplied to the first photo gate 110a, and VLb may represent a region where potentials or charges are accumulated when the second photo gate control signal PGb having a low level is supplied to the photo gate 112a.

In contrast, if the first transfer control signal MTGb having a first level (for example, 1.0 V) is supplied to the first transfer gate 112b and the second photo gate control signal PGb having a high level (for example, 3.3 V) is supplied to the second photo gate 112a, the charges generated in the P type substrate 102 may be collected under the second photo gate 112a and the collected charges may be transferred to the first floating diffusion node 112c directly or through the second bridging diffusion region 112m. Meanwhile, if the first transfer control signal MTGa having a first level (for example, 1.0 V) is supplied to the first transfer gate 110b and the first photo gate control signal PGa having a low level (for example, 0 V) is supplied to the first photo gate 110a, the charges may be generated in the P type substrate 102 under the first photo gate 110a, but the charges may not be transferred to the first floating diffusion node 110c.

Therefore, as illustrated in FIG. 5, for example, the first and second photo gates 110a and 112a may constitute, respectively, diode-connected metal oxide semiconductor (MOS) transistors T0a and T0b. The diode-connected MOS transistors T0a and T0b may substantially serve as depth sensing devices or elements.

For example, the first transfer gates 110b and 112b, to which the first transfer control signals MTGa and MTGb may be applied, may be combined with the first and second bridging diffusion regions 110m and 112m and the first floating diffusion nodes 110c and 112c to constitute, respectively, transfer transistors T1a and T1b of FIG. 5. The transfer transistors T1a and T1b may serve as a first charge transfer device or element. For example, the first reset gates 110d and 112d, to which first reset control signals MRGa and MRGb may be applied, may be combined with the first floating diffusion nodes 110c and 112c and a diffusion node to which a supply voltage VDD may be applied to constitute, respectively, first reset transistors T2a and T2b of FIG. 5. The first reset transistors T2a and T2b may serve as a first reset control device or element.

For example, the ambient light cancellation gates 110e and 112e, to which an ambient light cancellation signal NCS may be applied, may be combined with the first floating diffusion nodes 110c and 112c and the second floating diffusion nodes 110f and 112f to constitute, respectively, ambient light cancellation transistors T3a and T3b. The ambient light cancellation transistors T3a and T3b may serve as an ambient light cancellation device or element.

For example, the second reset gates 110g and 112g, to which the first reset control signals MRGa and MRGb may be applied, may be combined with the second floating diffusion nodes 110f and 112f and the diffusion node to which the supply voltage VDD may be applied to constitute, respectively, second reset transistors T4a and T4b of FIG. 5. The second reset transistors T4a and T4b may serve as a second reset control device.

For example, the drive gates 110h and 112h connected to the second floating diffusion nodes 110f and 112f may be combined with the first diffusion nodes 110n and 112n, to which the supply voltage VDD may be applied, and the second diffusion nodes 110p and 112p to constitute, respectively, drive transistors T5a and T5b of FIG. 5. The drive transistors T5a and T5b may serve as a driving device, that is, a source follow amplifier. For example, the select gates 110i and 112i, to which select control signals SELa and SELb may be applied, may be combined with the second diffusion nodes 110p and 112p and the third diffusion nodes 110q and 112q to constitute, respectively, select transistors T6a and T6b of FIG. 5. The select transistors T6a and T6b may serve as a select control device. The third diffusion nodes 110q and 112q may be connected to column lines CLa and CLb to output a sensing signal.

Referring to FIG. 4, a photo device that includes the PN junction areas 110j and 112j and constituting photodiodes PDa and PDb of FIG. 5 may be formed in the P type substrate 102 of the ambient light cancellation circuits NCCa and NCCb. The photodiodes PDa and PDb may be designed to have a size that is ⅓ or less of a size of the first and second photo gates 110a and 112a. That is, the size of the photodiodes PDa and PDb may be reduced to the extent that the photodiodes PDa and PDb may remain able to sense ambient light without exerting influence upon a depth sensing region.

Referring to FIG. 4, the third floating diffusion node 116 may be formed, for example, between the PN junction areas 110j and 112j in the P type substrate 102. The second transfer gate 110k may be formed, for example, on the P type substrate 102 between the third floating diffusion node 116 and the PN junction areas 110j and 112j, and the second transfer gate 112k may be formed, for example, on the P type substrate 102 between the third floating diffusion node 116 and the PN junction areas 110j and 112j. Second transfer control signals ATGa and ATGb may be applied, respectively, to the second transfer gates 110k and 112k.

Referring to FIG. 2, the supply voltage VDD may be applied to the third floating diffusion node 116 through the third reset gate 114 and the ground voltage GND (or VSS) may be applied to the third floating diffusion node 116 through the ground gate 118. Referring to FIG. 5, a second reset control signal ARG may be applied to the third reset gate 114 and a ground control signal AGG may be applied to the ground gate 118.

Referring to FIG. 4, for example, the second transfer gates 110k and 112k, to which the second transfer control signals ATGa and ATGb may be applied, may be combined with the PN junction areas 110j and 112j and the third floating diffusion node 116 to constitute, respectively, transfer transistors T7a and T7b of FIG. 5. The transfer transistors T7a and T7b may serve as a second charge transfer device. Referring to FIG. 2, for example, the third reset gate 114, to which the second reset control signal ARG (see FIG. 5) may be applied, may be combined with the third floating diffusion node 116 to constitute a reset transistor T8 of FIG. 5. The reset transistor T8 may serve as a third reset control signal. Referring to FIG. 2, for example, the ground gate 118, to which a shut-off control signal, that is, the ground control signal AGG (see FIG. 5) may be applied, may be combined with the third floating diffusion node 116 to constitute a shut-off control transistor T9 of FIG. 5. The shut-off control transistor T9 may serve as a shut-off control device. The ambient light cancellation circuits NCCa and NCCb may share the third floating diffusion node 116, the reset transistor T8, and the shut-off control transistor T9.

Figure 6:
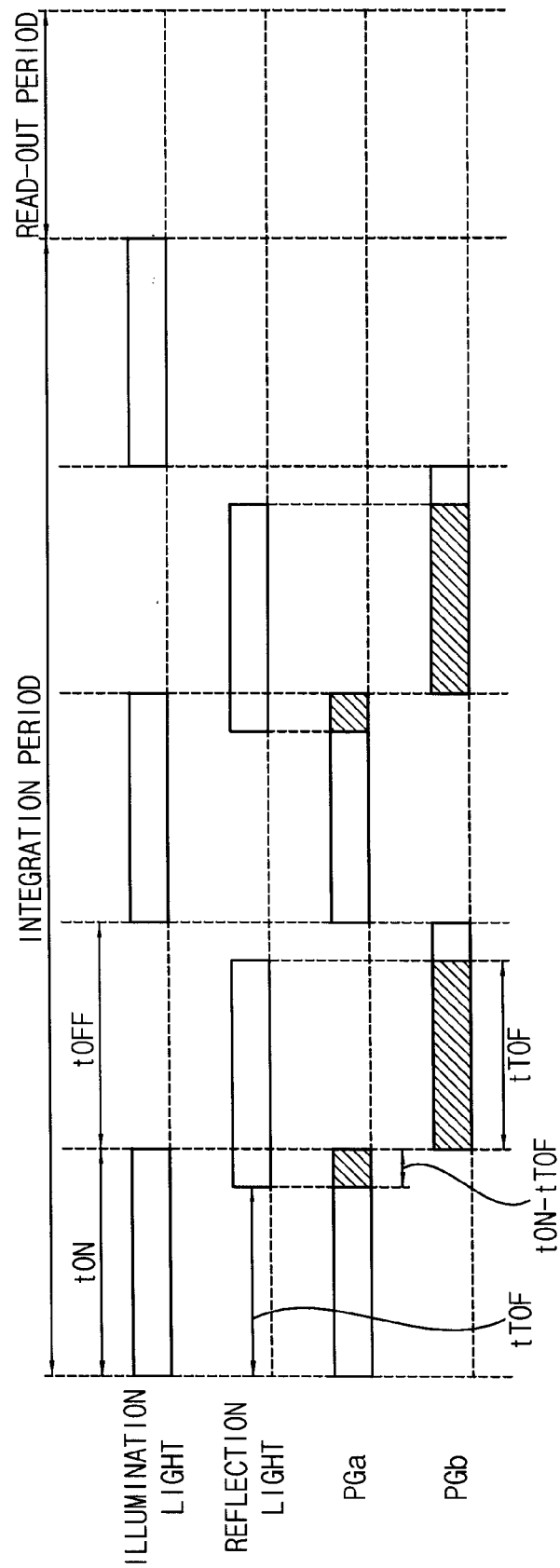
FIG. 6 is a timing chart illustrating an operation in an integration period of the equivalent circuit of FIG. 5.
Figure 7:
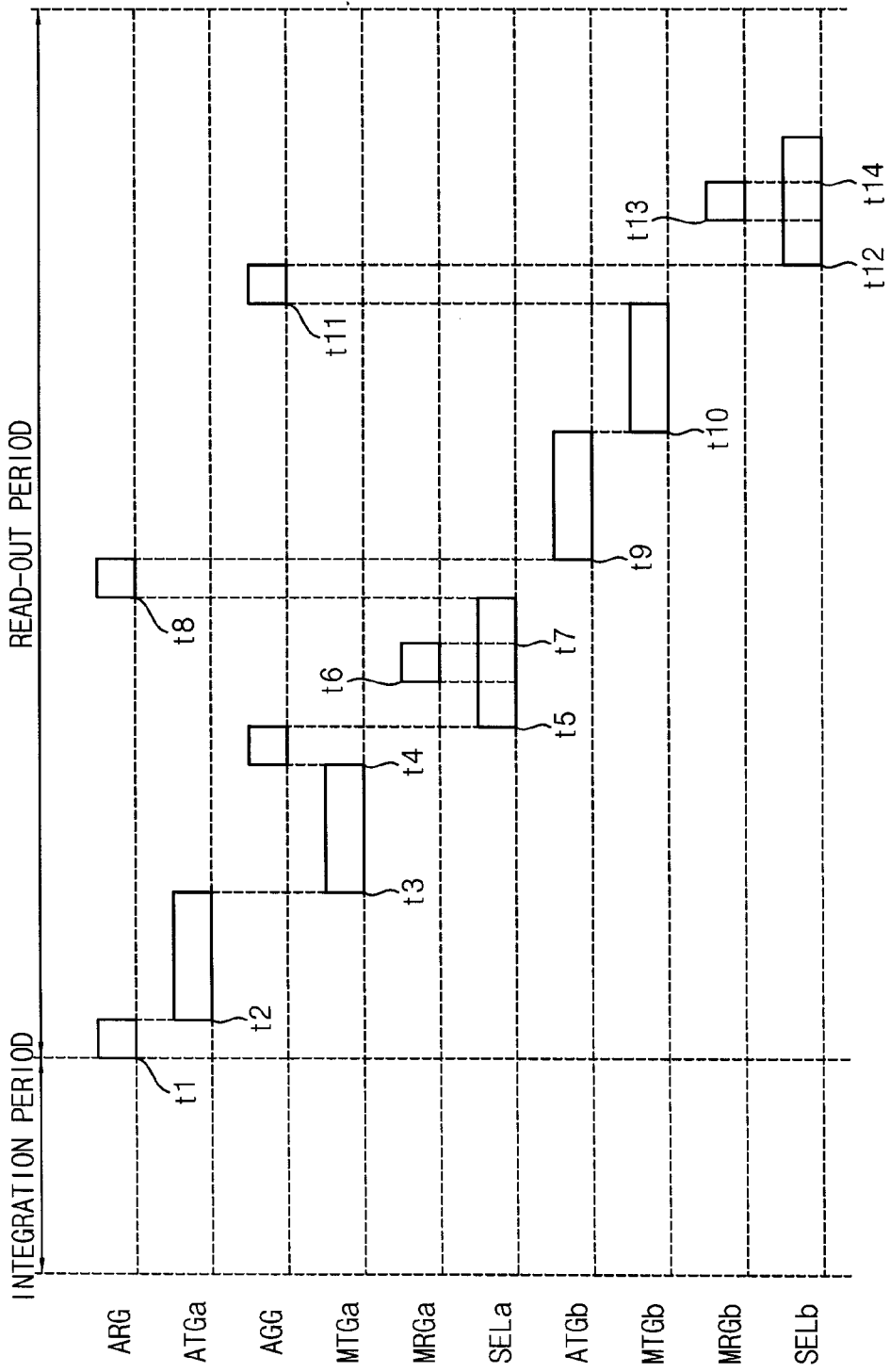
FIG. 7 is a timing chart illustrating an operation in a read-out period of the equivalent circuit of FIG. 5.

FIG. 6 is a timing chart that illustrates an operation in an integration period of the equivalent circuit of FIG. 5 and FIG. 7 is a timing chart that illustrates an operation in a read-out period of the equivalent circuit of FIG. 5.

Referring to FIGS. 1, 3, and 6, the light source 200 may be driven at a predetermined frequency (for example, 20 MHz) according to the driving signal LDS of the light source driver 160. The near-infrared light radiated from the light source 200 may be reflected from the subject 20 and the reflection light may be photographed on the pixel array 110. The first photo gate control signal PGa of the first photo gate 110a may have a phase the same as a phase of a waveform of an illumination light and the second photo gate control signal PGb of the second photo gate 110b may have a phase that may be phase-delayed from the waveform of the illumination light by an angle of 180°.

Therefore, the reflection light received in the activated first and second photo gates 110a and 112a may be photo-electrically converted into electron-hole pairs (EHP) in the P type substrate 102. At this time, the reflection light may include ambient light, such as, for example, solar light. Thus, different from the EHP formed by the reflection light, which may be reflected from the subject 20 only, the EHP formed in the P type substrate 102 by the ambient light, such as, for example, solar light, may include noise.

Referring to FIG. 6, the illumination light and the reflection light may be flickered at several tens of MHz during the integration period, so that a time period tTOF is very short (for example, a few nano seconds). Thus, the quantity of charges that correspond to a time period tON−tTOF (or tTOF) may be accumulated over several tens of thousands of cycles during the integration period and the accumulated quantity of charges may be concurrently read out in the read-out period to calculate the time period tTOF through following equations.

The quantity of charges $Qa$ and $Qb$ accumulated by N cycles through the first and second photo gates 110a and 112a may be expressed as equations 1 and 2.

$$Qa = N \times (tON - tTOF) \times i, \qquad \text{Equation 1}$$

wherein i represents the optical current formed by the reflection light.

$$Qb = N \times (tTOF) \times i. \qquad \text{Equation 2}$$

Therefore, the ratio of the quantity of charges Qa and Qb accumulated by N cycles through the first and second photo gates 110a and 112a may be expressed as equation 3.

$$\frac{Qa}{QB} = \frac{tON - tTOF}{tTOF} \qquad \text{Equation 3}$$

Equation 3 may be expressed as equation 4.

$$tTOF = \frac{tON \times Qb}{Qa + Qb} \qquad \text{Equation 4}$$

Therefore, a distance Z between an image sensor (for example, the image sensor 100) and a subject (for example, the subject 20) may be expressed as equation 5 by using equation 4.

$$Z = \frac{c}{2} \times tTOF, \qquad \text{Equation 5}$$

wherein c represents the velocity of light.

As described above, the quantity of charges Qa and Qb accumulated during the integration period may be read out during the read-out period and output through the microprocessor (not illustrated).

Referring to FIG. 7, the reset transistor T8 may be turned on as the second reset control signal ARG is applied to the third reset gate 114 of the reset transistor T8 of the ambient light cancellation circuit NCCa at a time point t1, so that the third floating diffusion node 116 is reset to the supply voltage VDD level.

At a time point t2, the transfer transistor T7a may be turned on as the second transfer control signal ATGa is applied to the second transfer gate 110k of the transfer transistor T7a, so that the level of the third floating diffusion node 116 is reduced to an ambient light cancellation level (VDD−VAa) through the photodiode PDa. An ambient light potential VAa may be generated from both terminals of the photodiode PDa in proportional to an intensity of the ambient light.

Therefore, an ambient light cancellation barrier may be formed in proportion to the ambient light cancellation level (VDD−VAa) applied to the ambient light cancellation gate 110e of the ambient light cancellation transistor T3a connected to the third floating diffusion node 116. That is, if the ambient light is strong, the voltage level applied to the ambient light cancellation gate 110e may be reduced so that a higher barrier is formed. In contrast, if the ambient light is weak, the voltage level applied to the ambient light cancellation gate 110e may be increased so that a lower barrier is formed.

After the ambient light cancellation barrier has been formed, the transfer transistor T1a may be turned on as the first transfer control signal MTGa is applied to the first transfer gate 110b of the transfer transistor T1a at a time point t3. Thus, the charges, which may be photo-electrically converted through the first photo gate 110a, may be transferred to the second floating diffusion node 110f through the transfer transistor T1a, the first floating diffusion node 110c, and the ambient light cancellation barrier of the ambient light cancellation transistor T3a. At this time, the quantity of charges transferred to the second floating diffusion node 110f may vary depending on the height of the ambient light cancellation barrier of the ambient light cancellation transistor T3a. Therefore, the charges generated by the ambient light may be blocked and only the charges generated by the reflection light may be transferred to the second floating diffusion node 110f.

Then, when the charge transfer has been completed at a time point t4, the shut-off control signal, that is, the ground control signal AGG may be applied to the ground gate 118 of the shut-off control transistor T9 so that the shut-off control transistor T9 may be turned on. Therefore, the level of the third floating diffusion node 116 may be reduced to the ground potential and the ambient light cancellation transistor T3a may be turned off so that the charge transfer to the second floating diffusion node 110f may be shut off.

The drive transistor T5a may output an amplified sensing signal that corresponds to the quantity of charges transferred to the second floating diffusion node 110f. Since the select transistor T6a may be turned on at a time point t5 as the select control signal SELa is applied to the select gate 110i of the select transistor T6a, the sensing signal may be output to the column line CLa. At a time point t6, the first and second reset transistors T2a and T4a may be turned on as the first reset control signal MRGa is applied to the second reset gate 110g of the first and second reset transistors T2a and T4a, so that the first and second floating diffusion nodes 110c and 110f may be reset to the supply voltage VDD level.

Thus, at a time point t7, a reference signal that has the supply voltage VDD level may be output to the column line CLa through the drive transistor T5a and the select transistor T6a due to the reset of the second floating diffusion node 110f. The reference signal may serve as a reference signal for the sensing signal.

Through the above operation, the quantity of charges (Qa), which may be photo-electrically converted from the reflection light by the first photo gate 110a, may be read out as the sensing signal and the sensing signal may be transferred to the microprocessor (not illustrated).

At a time point t8, the reset transistor T8 may be turned on as the second reset control signal ARG is applied to the third reset gate 114 of the reset transistor T8, so that the third floating diffusion node 116 may be reset to the supply voltage VDD level. At a time point t9, the transfer transistor T7b may be turned on as the second transfer control signal ATGb is applied to the second transfer gate 112k of the transfer transistor T7b, so that the level of the third floating diffusion node 116 may be reduced to an ambient light cancellation level (VDD−VAb) through the photodiode PDb. An ambient light potential VAb may be generated from both terminals of the photodiode PDa in proportion to an intensity of the ambient light.

Therefore, an ambient light cancellation barrier may be formed in proportion to the ambient light cancellation level (VDD−VAb) applied to the ambient light cancellation gate 112e of the ambient light cancellation transistor T3b connected to the third floating diffusion node 116. That is, if the ambient light is strong, the voltage level applied to the ambient light cancellation gate 112e may be reduced so that a higher barrier is formed. In contrast, if the ambient light is weak, the voltage level applied to the ambient light cancellation gate 112e may be increased so that a lower barrier is formed.

After the ambient light cancellation barrier has been formed, the transfer transistor T1b may be turned on as the first transfer control signal MTGb is applied to the first transfer gate 112b of the transfer transistor T1b at a time point t10.

Thus, the charges, which may be photo-electrically converted through the second photo gate 112a, may be transferred to the second floating diffusion node 112f through the transfer transistor T1b, the first floating diffusion node 112c, and the ambient light cancellation barrier of the ambient light cancellation transistor T3b. At this time, the quantity of charges transferred to the second floating diffusion node 112f may vary depending on the height of the ambient light cancellation barrier of the ambient light cancellation transistor T3b. Therefore, the charges generated by the ambient light may be blocked and only the charges generated by the reflection light may be transferred to the second floating diffusion node 112f.

Then, when the charge transfer has been completed at a time point t11, the ground control signal AGG may be applied to the ground gate 118 of the shut-off control transistor T9 so that the shut-off control transistor T9 may be turned on. Therefore, the level of the third floating diffusion node 116 may be reduced to the ground potential and the ambient light cancellation transistor T3b may be turned off so that the charge transfer to the second floating diffusion node 112f may be shut off.

The drive transistor T5b may output an amplified sensing signal that corresponds to the quantity of charges transferred to the second floating diffusion node 112f. Since the select transistor T6b may be turned on at a time point t12 as the select control signal SELb is applied to the select gate 112i of the select transistor T6b, the sensing signal may be output to the column line CLb. At a time point t13, the first and second reset transistors T2b and T4b may be turned on as the first reset control signal MRGb is applied to the second reset gate 112g of the first and second reset transistors T2b and T4b, so that the first and second floating diffusion nodes 112c and 112f may be reset to the supply voltage VDD level.

Thus, at a time point t14, a reference signal that has the supply voltage VDD level may be output to the column line CLb through the drive transistor T5b and the select transistor T6b due to the reset of the second floating diffusion node 112f. The reference signal may serve as a reference signal for the sensing signal.

Through the above operation, the quantity of charges (Qb), which may be photo-electrically converted from the reflection light by the second photo gate 112a, may be read out as the sensing signal and the sensing signal is transferred to the microprocessor (not illustrated). Thus, the microprocessor may calculate the distance Z by applying the quantity of charges Qa and Qb, which may be received during the read-out period, to equations 4 and 5.

Figure 8:
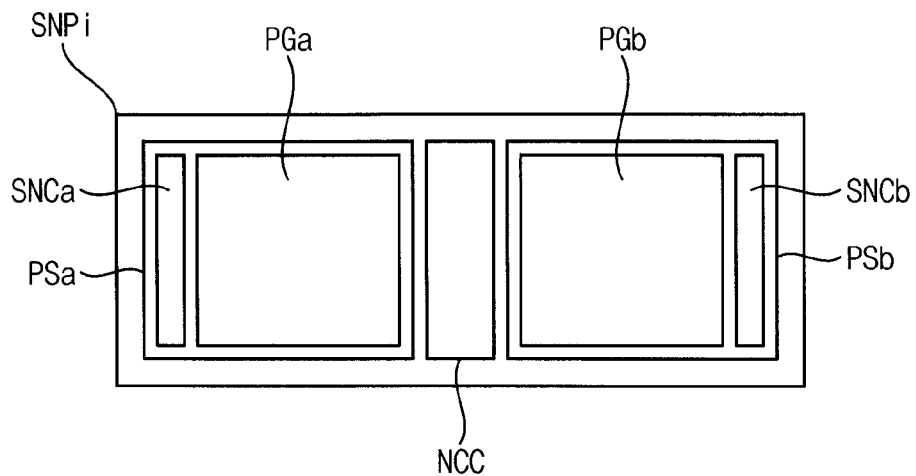
FIG. 8 is a partial plan view illustrating a layout of a depth sensor according to an embodiment of the inventive concept.

FIG. 8 is a partial plan view that illustrates a layout of the depth sensor SNPi according to an embodiment of the inventive concept.

Referring to FIG. 8, the depth sensor SNPi according to an example embodiment of the inventive concept includes a pair of photo sensor circuits PSa and PSb and one ambient light cancellation circuit NCC. The embodiment of FIG. 8 is different from the embodiment of FIG. 5 in that the pair of photo sensor circuits PSa and PSb may share one ambient light cancellation circuit NCC instead of providing a pair of ambient light cancellation circuits NCCa and NCCb.

Figure 9:
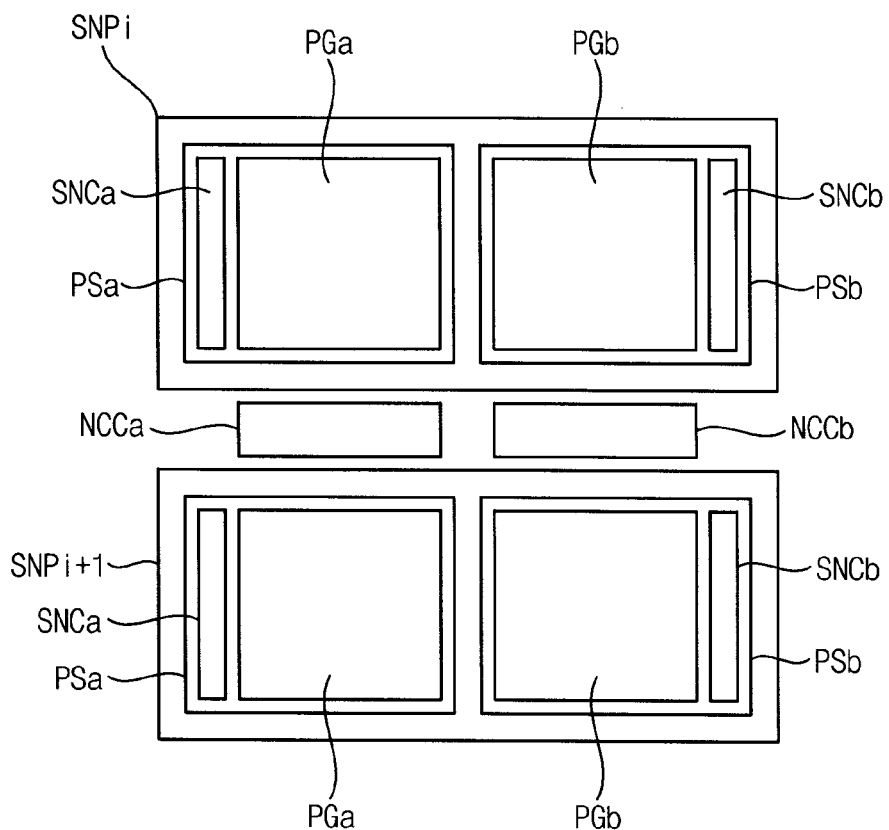
FIG. 9 is a partial plan view illustrating a layout of a depth sensor according to an embodiment of the inventive concept.

FIG. 9 is a partial plan view that illustrates a layout of the depth sensors SNPi and SNPi+1 according to an embodiment of the inventive concept.

Referring to FIG. 9, this embodiment is different from the previous embodiments in that the ambient light cancellation circuits NCCa and NCCb may be disposed between the depth sensors SNPi and SNPi+1. That is, the photo sensor circuit PSa of the depth sensor SNPi and the photo sensor circuit PSa of the depth sensor SNPi+1 may share the ambient light cancellation circuit NCCa and the photo sensor circuit PSb of the depth sensor SNPi+1 and the photo sensor circuit PSb of the depth sensor SNPi+1 may share the ambient light cancellation circuit NCCb.

Figure 10:
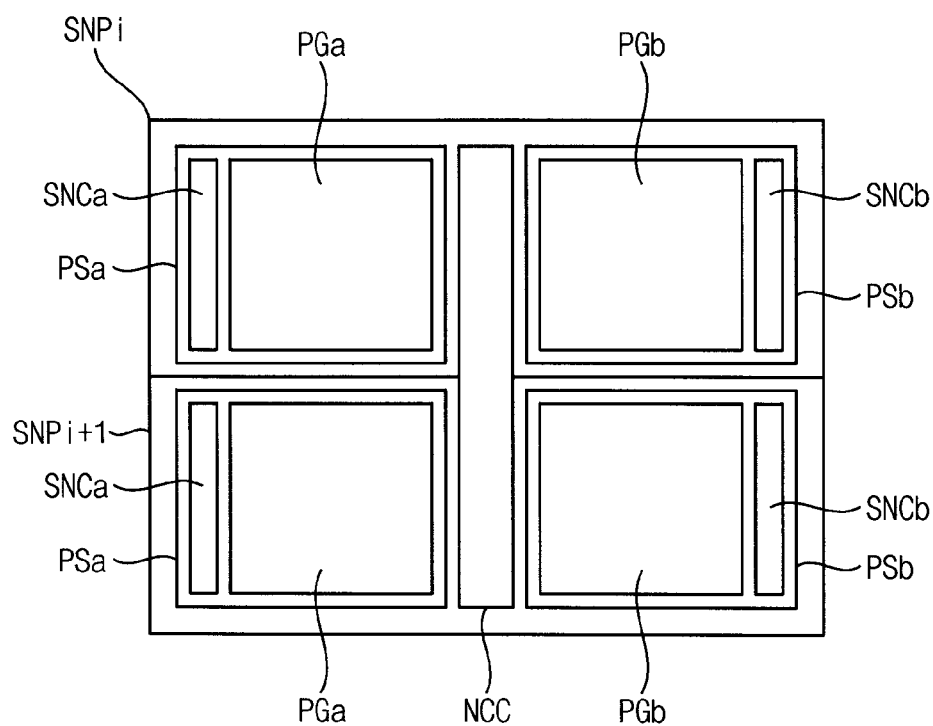
FIG. 10 is a partial plan view illustrating a layout of a depth sensor according to an embodiment of the inventive concept.

FIG. 10 is a partial plan view that illustrates a layout of the depth sensors SNPi and SNPi+1 according to an embodiment of the inventive concept.

Referring to FIG. 10, this embodiment is different from the previous embodiments in that the ambient light cancellation circuit NCC may be disposed between the depth sensors SNPi and SNPi+1. That is, the photo sensor circuits PSa and PSb of the depth sensor SNPi and the photo sensor circuits PSa and PSb of the depth sensor SNPi+1 may share one ambient light cancellation circuit NCC.

The illustrated embodiments of the inventive concept are useful for a three dimensional depth sensor that employs the time of flight (TOF) scheme. According to the illustrated embodiments, electrons may be collected from among electron-hole pairs (EHP) generated from ambient light by using a photodiode of a small pixel adjacent to a photo gate in order to calculate a relative quantity of the ambient light of a depth sensor. A barrier level may be formed in correspondence with the quantity of the ambient light. Thus, only the charges derived from reflection light, other than the ambient light, may be sensed so that a superior depth error characteristic may be achieved. The illustrated embodiments may be usefully employed, for example, in a three dimensional distance sensor, a game controller, a depth camera, and/or a gesture sensing apparatus.

Figure 11:
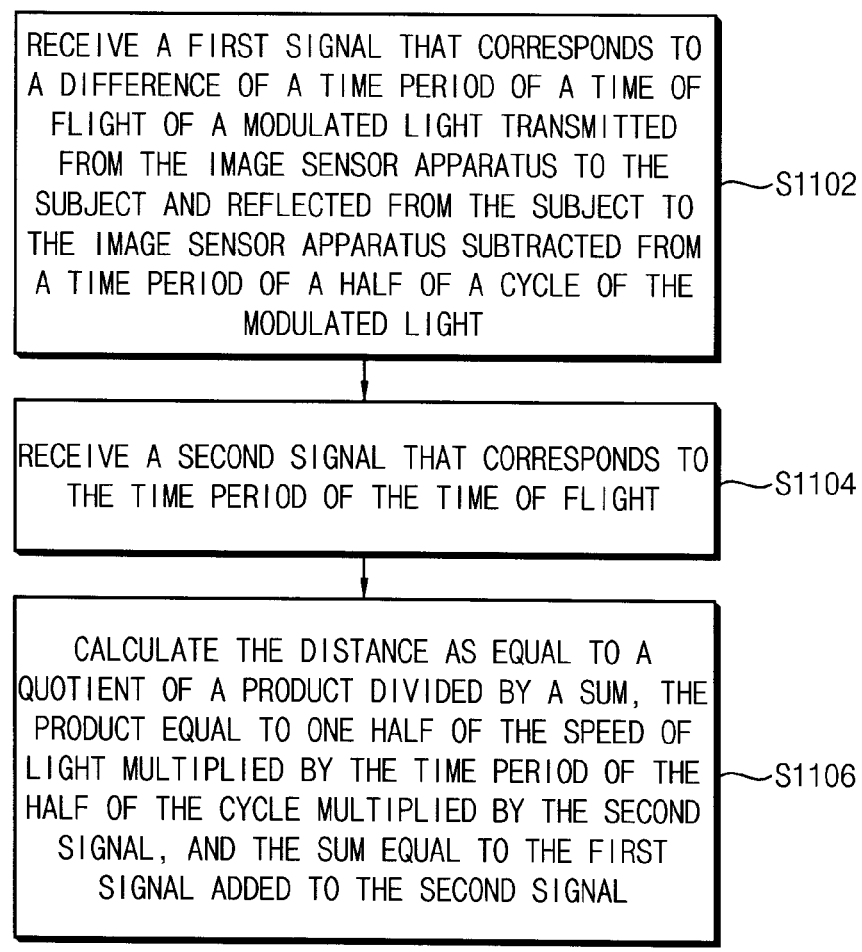
FIG. 11 is a flowchart illustrating a method of calculating a distance between an image sensor apparatus and a subject according to an embodiment of the inventive concept.

FIG. 11 is a flowchart that illustrates a method 1100 of calculating a distance between an image sensor apparatus and a subject according to an embodiment of the inventive concept.

In an operation 1102 of the method 1100, a first signal that corresponds to a difference of a time period of a time of flight of a modulated light transmitted from the image sensor apparatus to the subject and reflected from the subject to the image sensor apparatus subtracted from a time period of a half of a cycle of the modulated light may be received at an electronic processor.

In an operation 1104 of the method 1100, a second signal that corresponds to the time period of the time of flight may be received at the electronic processor.

Optionally, each of the first signal and the second signal may have a compensation for an effect of ambient light. Optionally, the compensation may be accomplished by establishing a barrier to a transfer of charges that is proportional to an intensity of the ambient light. Optionally, the compensation may include a first compensation for the first signal and a second compensation for the second signal, the first compensation may be different from the second compensation.

In an operation 1106 of the method 1100, the distance may be calculated, via the electronic processor, as equal to a quotient of a product divided by a sum, the product equal to one half of the speed of light multiplied by the time period of the half of the cycle multiplied by the second signal, and the sum equal to the first signal added to the second signal.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

The foregoing is illustrative of various embodiments and is not to be construed as limiting thereof. Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A depth pixel of an image sensor, comprising:
    a depth sensing element configured to generate first charges that are photo-electrically converted from a light reflected from an object;
    a first floating diffusion node configured to receive the first charges from the depth sensing element;
    a second floating diffusion node configured to output second charges corresponding to a component of a reflection light where a component of an ambient light is cancelled; and
    an ambient light cancellation circuit configured to detect the ambient light to control a barrier level of a charge transfer path between the first floating diffusion node and the second floating diffusion node in response to the ambient light.

2. The depth pixel of claim 1, wherein the ambient light cancellation circuit comprises:
    a photo sensing element configured to generate third charges that are photo-electrically converted from the ambient light;
    a third floating diffusion node;
    a charge transfer element configured to transfer the third charges from the photo sensing element to the third floating diffusion node in response to a transfer control signal; and
    an ambient light cancellation element connected between the first floating diffusion node and the second floating diffusion node and configured to form the barrier level of the charge transfer path in response to the third charges transferred from the photo sensing element to the third floating diffusion node.

3. The depth pixel of claim 2, wherein the photo sensing element is disposed adjacent to the depth sensing element and the photo sensing element has a light receiving area smaller than a light receiving area of the depth sensing element.

4. The depth pixel of claim 2, wherein the ambient light cancellation circuit further comprises a reset control element configured to reset the third floating diffusion node to a reset state in response to a reset control signal.

5. The depth pixel of claim 4, wherein the ambient light cancellation circuit further comprises a shut-off control element configured to set the third floating diffusion node to a shut-off state in response to a shut-off control signal to block a charge transfer between the first floating diffusion node and the second floating diffusion node.

6. The depth pixel of claim 5, wherein the ambient light cancellation element is configured to be activated before the first charges of the depth sensing element are transferred to the first floating diffusion node.

7. The depth pixel of claim 6, wherein the first floating diffusion node and the second floating diffusion node are configured to be reset after the ambient light cancellation element is set to the shut-off state.

8. The depth pixel of claim 3, wherein the depth sensing element comprises a pair of photo gates and the ambient light cancellation circuit is disposed adjacent to the photo gates.

9. The depth pixel of claim 3, wherein the depth sensing element comprises a pair of photo gates and the ambient light cancellation circuit is disposed between the photo gates.

10. The depth pixel of claim 3, wherein the depth sensing element comprises a pair of depth sensing elements and the ambient light cancellation circuit is disposed between the pair of depth sensing elements and shared by the pair of depth sensing elements.

11. An image pick-up apparatus, comprising:
    a light source configured to radiate a modulation light; and
    a pixel array in which a plurality of depth pixels are arranged in a form of a matrix, at least one depth pixel comprising:
        a depth sensing element configured to generate first charges that are photo-electrically converted from a light, which includes the modulation light, reflected from an object;
        a first floating diffusion node configured to receive the first charges from the depth sensing element;
        a second floating diffusion node configured to output second charges corresponding to a component of a reflection light where a component of an ambient light is cancelled; and
        an ambient light cancellation circuit configured to detect the ambient light to control a barrier level of a charge transfer path between the first floating diffusion node and the second floating diffusion node in response to the ambient light.

12. The image pick-up apparatus of claim 11, wherein the ambient light cancellation circuit comprises:
    a photo sensing element configured to generate third charges that are photo-electrically converted from the ambient light;
    a third floating diffusion node;
    a charge transfer element configured to transfer the third charges from the photo sensing element to the third floating diffusion node in response to a transfer control signal; and
    an ambient light cancellation element connected between the first floating diffusion node and the second floating diffusion node and configured to form the barrier level of the charge transfer path in response to the third charges transferred from the photo sensing element to the third floating diffusion node.

13. The image pick-up apparatus of claim 12, wherein the ambient light cancellation circuit further comprises a reset control element configured to reset the third floating diffusion node to a reset state in response to a reset control signal.

14. The image pick-up apparatus of claim 13, wherein the ambient light cancellation circuit further comprises a shut-off control element configured to set the third floating diffusion node to a shut-off state in response to a shut-off control signal to block a charge transfer between the first diffusion node and the second floating diffusion node.

15. The image pick-up apparatus of claim 14, wherein the ambient light cancellation element is configured to be activated before the first charges of the depth sensing element are transferred to the first floating diffusion node.

16. A method of calculating a distance between an image sensor apparatus and a subject, the method comprising:
receiving, at an electronic processor, a first signal that corresponds to a difference of a time period of a time of flight of a modulated light transmitted from the image sensor apparatus to the subject and reflected from the subject to the image sensor apparatus subtracted from a time period of a half of a cycle of the modulated light;
receiving, at the electronic processor, a second signal that corresponds to the time period of the time of flight; and
calculating, via the electronic processor, the distance as equal to a quotient of a product divided by a sum, the product equal to one half of the speed of light multiplied by the time period of the half of the cycle multiplied by the second signal, and the sum equal to the first signal added to the second signal,
wherein each of the first signal and the second signal has a compensation for an effect of ambient light, and
wherein the compensation is accomplished by establishing a barrier to a transfer of charges that is proportional to an intensity of the ambient light.

17. The method of claim 16, wherein the compensation includes a first compensation for the first signal and a second compensation for the second signal, the first compensation different from the second compensation.

18. A non-transitory computer-readable recording medium containing instructions which, when executed by an electronic processing element, cause the electronic processing element to perform the method of claim 16.

\* \* \* \* \*